(12) United States Patent
Welch

(10) Patent No.: US 12,136,661 B2
(45) Date of Patent: Nov. 5, 2024

(54) COMPACT CMOS

(71) Applicant: James D. Welch, Omaha, NE (US)

(72) Inventor: James D. Welch, Omaha, NE (US)

( * ) Notice: Subject to any disclaimer, the term of this patent is extended or adjusted under 35 U.S.C. 154(b) by 426 days.

(21) Appl. No.: 17/300,746

(22) Filed: Oct. 18, 2021

(65) Prior Publication Data

US 2023/0117871 A1 Apr. 20, 2023

Related U.S. Application Data

(63) Continuation-in-part of application No. 16/974,016, filed on Sep. 8, 2020, now Pat. No. 11,798,946.

(51) Int. Cl.
*H01L 29/66* (2006.01)
*H01L 21/8238* (2006.01)
*H01L 27/092* (2006.01)

(52) U.S. Cl.
CPC ............... *H01L 29/66795* (2013.01); *H01L 21/823821* (2013.01); *H01L 21/823871* (2013.01); *H01L 27/0924* (2013.01)

(58) Field of Classification Search
CPC ....... H01L 29/66795; H01L 21/823821; H01L 21/823871; H01L 27/0924; H01L 21/8206; H01L 21/8213; H01L 21/8252; H01L 21/8254; H01L 27/0605; H01L 27/092
See application file for complete search history.

(56) References Cited

U.S. PATENT DOCUMENTS

| | | |
|---|---|---|
| 4,696,093 A | 9/1987 | Welch |
| 5,663,584 A | 9/1997 | Welch |
| 5,760,449 A | 6/1998 | Welch |
| 6,091,128 A | 6/2000 | Welch |
| 6,268,636 B1 * | 7/2001 | Welch ................... H01L 27/092 257/E27.068 |
| 6,413,802 B1 | 7/2002 | Hu et al. |
| 6,624,493 B1 | 9/2003 | Welch |
| 8,426,298 B2 * | 4/2013 | Ko .................. H01L 21/823814 438/570 |
| 9,786,758 B1 * | 10/2017 | Balakrishnan ...... H01L 29/7839 |
| 2003/0235936 A1 * | 12/2003 | Snyder ............ H01L 21/823842 438/581 |
| 2005/0104152 A1 * | 5/2005 | Snyder ............ H01L 21/823814 257/E27.068 |

(Continued)

OTHER PUBLICATIONS

Welch, J. D. "Fabrication of Sub-Micron Channel DMOS-Type MOSFETS by Ion-Implantation of Source, Drain and Channel." ISAST Transactions on Computers and Intelligent Systems, No. 2, vol. 3, 2011. (Year: 2011).*

(Continued)

*Primary Examiner* — Karen Kusumakar
*Assistant Examiner* — Adam S Bowen
(74) *Attorney, Agent, or Firm* — James D. Welch

(57) ABSTRACT

A Compact CMOS System having a non-split Channel Regions Controlling Gate, including a material which forms rectifying junctions with both N and P-type Field Induced Semiconductor, and at least two Channels electrically connected thereto and projecting substantially away therefrom adjacent and parallel to one another. There further being substantially non-rectifying junctions to the material which forms a rectifying junction with both N and P-type Field Induced Semiconductor, and to distal ends of the at least two Channels.

5 Claims, 2 Drawing Sheets

(56) References Cited

U.S. PATENT DOCUMENTS

| | | | | |
|---|---|---|---|---|
| 2008/0093676 | A1* | 4/2008 | Shingu | H01L 29/4975 |
| | | | | 257/386 |
| 2008/0227241 | A1* | 9/2008 | Nakabayashi | H01L 29/785 |
| | | | | 438/150 |
| 2009/0008726 | A1* | 1/2009 | Yamauchi | H01L 21/823842 |
| | | | | 257/E47.001 |
| 2009/0162983 | A1* | 6/2009 | Park | H01L 29/66795 |
| | | | | 257/E21.441 |
| 2017/0323970 | A1* | 11/2017 | Dolny | H01L 29/7825 |
| 2018/0358352 | A1* | 12/2018 | Voldman | H01L 27/0255 |
| 2022/0012576 | A1* | 1/2022 | Choi | G06N 3/065 |

OTHER PUBLICATIONS

Welch, J. D. "Mid-Bandgap Doped Junction, Single Semiconductor Type Device Alternative to Conventional Dual Device CMOS." ISAST Transactions on Electronics and Signal Processing, No. 1, vol. 4, 2010. (Year: 2010).*

Welch, J. D. "Insight to Operation of a Mid-Bandgap Doped Junction, Single Semiconductor Type Device Alternative to Conventional Dual Device CMOS." ISAST Transactions on Computers and Intelligent Systems, No. 1, vol. 3, 2010. (Year: 2010).*

Welch, J. D., J. A. Davies, and R. S. C. Cobbold. "Migration of ion-implanted krypton in silicon during anneal." Journal of Applied Physics 48.11 (1977): 4540-4543. (Year: 1977).*

Yang Jie, For Longer-Range EVs, a Cousin of Silicon makes a Material Difference, Wall Street Journal, Oct. 7, 2021 (Year: 2021).*

* cited by examiner

ΔV' = PINCHOFF VOLTAGE DROP

ΔV" = SILICON CHANNEL VOLTAGE DROP

ΔV = ΔV' + ΔV" & IS "OFF" HALF SILICON CHANNEL CARRIER INDUCING GATE VOLTAGE

COMPACT CMOS

This Application is a CIP of Pending application Ser. No. 16/974,016 Filed Sep. 8, 2020.

TECHNICAL FIELD

The present invention relates to Complementary Metal Oxide Semiconductor (CMOS) technology, and more particularly to, in a preferred embodiment, a Compact CMOS System comprising a material which forms a rectifying junction with either N and P-type Field Induced Semiconductor, and substantially parallel and adjacent Channels at once subject to control by a single Gate.

BACKGROUND

CMOS systems are well established, with an improvement in recent years being FINFET geometry, which had its origin about 20 or so years ago as demonstrated by Patent to Hu et al., U.S. Pat. No. 6,413,802 which is incorporated hereinto by reference. "FIN" is terminology given to semiconductor projections from a planar surface of a semiconductor substrate as they resemble fins on fish. The geometry of the FIN allows for application of MOS Gate Electrodes not only above a Channel of a MOSFET formed in a substrate, but also to Sides of the effective 3D Structure. There are literally thousands of FINFET references now available, but none of which Inventor Welch is aware remotely disclose the present invention.

Continuing, Inventor Welch previously Patented the use of material which forms rectifying junctions with both N and P-type Silicon, whether the effective doping type is metallurgical or field induced. See U.S. Pat. Nos. 6,624,493; 5,663,584; 5,760,449; 6,091,128 and 6,268,636, (all of which are incorporated hereinto by reference). The listed Patents to Welch report work performed under a Grant from the US Dept. of Energy under Contract No. DE-FG47-93R701314, beginning in 1992. The work was performed in the 1990's and early 2000's at the University of Nebraska Electrical Engineering Dept. Another related Welch is U.S. Pat. No. 4,696,093, upon which the DOE Grant was initially based. In prior work, Inventor Welch had hands-on discovered that Chromium Disilicide was formed in Silicon by annealing Chromium (deposited via Electron beam or Sputtering onto Silicon) at about 600 degrees Centigrade, and said Chromium Disilicide forms rectifying junctions with either both N and P-type Silicon. Welch discovered, when following up on a request from his Professor (R.S.C. Cobbold), that Chromium Disilicide formed a very good rectifying with N-type Silicon during his Masters work at Toronto in the early 70's when seeking to learn if Chromium deposited on $SiO_2$ migrated thereinto during a 600 degree C. anneal. (See "Migration of Ion-Implanted Krypton in Silicon During Anneal", Welch, Davies and Cobbold, J. Appl. Physics, Vol. 48, No. 11, November 1977) for discussion of migration properties of Amorphizing Krypton ions implanted into silicon at various doses and energies during anneal). That temperature was important as his DMOST-type fabrication process as that involved regrowth of an amorphized region at the surface of a substrate, into a single crystal thereby incorporating ion implanted Boron and Phosphorous dopants onto electrically active substitutional sites in a single anneal, and while the anneal was performed Chromium was present as a self-aligned atop an $SiO_2$ Gate Dielectric. To investigate Chromium migration in $SiO_2$ during anneal Welch applied Chromium to the back unpolished side of a substrate for electrical contact purposes, upon which, on the polished side thereof, was formed a MOS Capacitor. Comparing Capacitance before and after the 600 degree C. annealing resulted in the Capacitance decreasing when, if anything, an increased in the Capacitance decreasing when, if anything, an increased Capacitance was expected due to Oxide thinning caused by Chromium migration. The discovered effect was traced to the formation of a Capacitance providing rectifying junction on the rough unpolished backside of the substrate. (This was reported in his MASc. Thesis titled "Design and Fabrication of Sub-Micron Channel by Double Ion Implantation", MASC. Dissertation, University of Toronto, 1974. See also "Fabrication of Sub-micron Channel DMOST-Type MOSFTETS by Ion-Implantation of Source, Drain and Channel", ISAST Transactions on Computers and Intelligent Systems, No. 2, Vol. 3, 2011). Inventor Welch's MASc. hands-on research resulted in operational Sub-micron Channel length DMOST-type MOSFETS fabricated by ion-implantation techniques, rather than pre-deposition and drive-in diffusions. Literature searching in about 1984, soon after Inventor Welch had completed his LawDegree at the University of Nebraska and tested into the Patent and Nebraska State Bar, turned up an article by Lepselter and Sultanov titled "Some Properties of Chromium Doped Silicon", in Soviet Physics Semiconductors", Vol. 4, No. 11, Pages 1900-1902 May 1972 described the formation of a rectifying junction when Chromium is diffused into P-type Silicon. It was at that time Inventor Welch conceived using Chromium as a "dopant" in both N and P-type Silicon, to form a CMOS system and sought a Grant to investigate the effect. That effort eventually led to a Grant from the US Department of Energy (DOE).

A summary of the MASc. work, and the results of the work performed under the DOE Grant are presented in an unpublished proposed Ph. D. Thesis titled "Mid-Bandgap Doped Junction, Single Semiconductor Device Alternative to Conventional Dual Device CMOS, Fabrication Thereof, Operational Results, and Analysis".

Said unpublished Thesis is available from Inventor Welch at jdwscmos1@netzero.net In addition two articles "Mid-Bandgap Doped Junction, Single Semiconductor Type Device Alternative to Conventional Dual Device CMOS", Welch, ISAST Transactions on Electronics and Signal Processing, No. 1, Vol. 4, 2010, and "Insight to Operation of a Mid-Bandgap Doped Junction Single Semiconductor Type Device Alternative to Conventional Dual Device CMOS", Welch, ISAST Transactions On Computers and Intelligent Systems, No. 1, Vol. 3, 2010), are also identified which report the same work.

Recently Inventor Welch studied FINFET systems, and in view thereof has conceived a simple approach to fabricating a compact FINFET CMOS System, which is disclosed herein. There remains need for CMOS systems that enable higher packing density of devices, and therefore prolong the validity of Moore's Law.

DISCLOSURE OF THE INVENTION

The present invention is a primarily a Compact CMOS Structure that provides two adjacent MOSFET Channel regions parallel to, or substantially so, one another; which channel regions both contact a single region in said semiconductor that forms rectifying junctions with both N and P-type doped, or field induced versions thereof at one end thereof, and with separate ohmic regions at the other end thereof. The structure can possibly be fabricated in any suitable Semiconductor, (eg. Si. Ge, CdTe, CdZnTe, CdSe, CdZnSe, HgI2, RlBrl, Inl, GaSe, Diamond, TlBr, PbI2, InP, ZZnTe, HgBrl, BP, GaP, CdS, SiC, Alb, PbO, BiI3, ZnSe etc,) although Inventor Welch has focused primarily Silicon in his hands-on work.

The present invention is further a compact CMOS structure comprising a region of material in a semiconductor substrate which forms rectifying junctions with both field induced N and P-type semiconductor. Conception of the present invention resulted from a study of FINFET Technology, wherein a plurality of Fins which comprise Channel Regions extending between a Source and Drain of a MOSFET. Inventor Welch conceived of present invention structure when considering replacing the Drains with a region of material that forms rectifying junctions with both N and P-type material. The compact CMOS structure, in one embodiment, then further comprises at least two FINS (used synonymous with Channel Region herein) projecting from electrical contact with said region of material in a semiconductor substrate which forms rectifying junctions with both field induced N and P-type semiconductor, said FINS being substantially parallel and adjacent to one another. Said compact FINFET CMOS structure further comprises a gate structure offset with respect to said FINS by insulating material. The compact FINFET CMOS structure further comprises substantially non-rectifying junctions to said material which forms rectifying junctions with both field induced N and P-type semiconductor, and to distal ends of said at least two FINS.

The present invention, while conceived in view of FINFETS, does not require the presence of Fins, and can be produced in Planar Semiconductor. As such the present invention structure can be fabricated so that a relatively thick insulator is first provided at the surface of a semiconductor substrate, and that said relatively thick oxide is, above what are to be Channel Regions, thinned to provide a suitable Gate insulator.

It should especially be appreciated that the present invention does not require space consuming alternating N and P-type regions in a substrate, but rather uses only a substrate that, at least in the regions of said channels is characterized by a selection from the group consisting of:
it is substantially or per se. intrinsic;
it is substantially or per se. compensated;
it contains both N and P-type dopants in unequal concentrations.

Importantly, in the foregoing realize that the Gate is a Single Structure that at once affect the parallel and adjacent Channels in a similar manner. Conventional CMOS is by geometric necessity a Split Gate Structure.

In use a voltage is applied between the substantially non-rectifying junctions to the distal ends of said at least two FINS and a voltage is applied to said gate which, when switched between the voltages applied to the substantially non-rectifying distal ends of said at least two FINS (ie. channel regions in planar semiconductor) causes a voltage to appear at the substantially non-rectifying junction to said region of material which forms rectifying junctions with both field induced N and P-type semiconductor which is inverted. That is, when the higher of said voltages applied to the substantially non-rectifying junctions to the distal ends of said at least two FINS is applied to said gate the voltage at the substantially non-rectifying junction to said region of material which forms rectifying junctions with both field induced N and P-type semiconductor is low, and vice-versa.

It is noted that the at least two FINS/Planar Channels can be made of silicon, and the region of material which forms rectifying junctions with both field induced N and P-type semiconductor is chromium disilicide, however the present invention can utilize any suitable Semiconductor (GaAs, SiC etc), although the methods of fabrication will vary.

Methodology of fabrication and materials used as dopants and MOS Gate Insulators, of course, varies with the specific Semiconductor involved. However, a demonstrative method based in Inventor Welch's experience with Silicon can be formulated.

A method of fabricating a CMOS semiconductor system then can comprise the steps of:
a) selecting a semiconductor substrate having at least one polished side;
b) depositing or growing thick insulator (more than 1000 Angstroms) on at least one polished surface thereof;
c) etching through the thick insulator regions where substantially parallel and adjacent channel regions are to exist and performing a selection from the group consisting of:
etching the thick insulator so that it is of a proper depth to act as a gate insulator; and
etching the thick insulator to expose the semiconductor and then growing or depositing an insulator in said regions which is of a proper depth to act as a gate insulator;
d) etching an opening through the thick insulator regions where material that forms rectifying junctions with both N and P-type semiconductor is to be present;
e) depositing material that forms rectifying junctions with both N and P-type semiconductor;
f) causing the deposited material that forms rectifying junctions with both N and P-type semiconductor to form rectifying junctions in the regions opened in step e);
g) removing material that forms rectifying junctions with both N and P-type semiconductor in all areas other than in the region opened in step e);
h) opening areas in the thick insulator where ohmic contact to ends of channel regions are to be present;
i) depositing a metal over the entire substrate;
i) delineating the system such that said metal provides pairs of channels in the semiconductor, each pair of channels projecting from the region of material that forms rectifying junctions with both N and P-type semiconductor, and ending at separate ohmic contact region; while also delineating ohmic contacts with regions of said material that forms rectifying junctions with both N and P-type semiconductor;
j) causing said delineated system to form ohmic contacts at the ends of channels and with the regions of material that forms rectifying junctions with both N and P-type semiconductor.

Said method can involve an additional step being conducted between steps a) and b), said additional step comprising conducting a semiconductor etch that form a multiplicity of substantially parallel and adjacent pairs of FINS at channel locations, each of which projects from the polished surface of said substrate and the method is one of fabricating compact FINFET CMOS systems.

Said method can involve that the methods provide that the substrate is silicon, the material that forms rectifying junctions with both N and P-type semiconductor in step e) is chromium which is annealed to produce chromium disilicide, the insulator is $SiO_2$ and the metal deposited in step i) is aluminum.

Said method can involve that step b) involves thinning the grown or deposited insulator in the cannel regions, or removing all grown or deposited insulator in channel regions and then growing or depositing a fairly thin (eg. less than 1000 Angstroms) insulating layer of insulator at said locations.

Note, in step b) it might be necessary to grow or deposit a fairly thick (eg. 5000 Angstroms up to Microns) insulating layer and then thin it in the cannel regions, and/or in step i) designing the delineation masking to provide removal of Gate material other than where the channels are present. This could involve removing all insulator in the channel regions and again growing or depositing a thinner layer of insulator appropriate for use as a Gate insulator (eg. 1000 Angstroms or less). In particular, FIG. 2 should be viewed as a non-limiting example only. The important thing to take from FIG. 2 is that the Gate (G) affects both Channels (F1) (F2) similarly at once, as they are in close proximity. In conventional CMOS the N and P Channel devices the two Gates involved and are electrically accessed separately. Further, it is to be appreciated that the "channels referred to are simply regions in a substrate which become affected to contain electrical carriers by a voltage applied to the gate. When the channel regions constitute FINS however, they are, of course, more easily defined by observable device geometry. Further, the language "substantially parallel", of course, includes the case where the channel regions are in fact actually parallel.

Said method can also involve that the semiconductor is specifically Silicon Carbide and that the material that forms rectifying junctions with both N and P-type semiconductor in step e) is possibly Vanadium which is annealed to produce providing a near Mid-bandgap Doping state in 4H-SiC and 6H-SiC, the insulator is possibly $SiO_2$ and the ohmic junction forming metal deposited is, for instance, formed from TiAl. While this has not been further investigated at this time, Inventor Welch looked into it after receiving a copy of a Wall Street Journal Article concerning the use of SiC in Semiconductor Devices in October 2021, from a friend, Terry Pirrucello, whom he's known since High School, and whom is familiar with his work in Solid State Devices. At first look, SiC does seem to be very well suited to use as the present invention Semiconductor because of its larger Bandgap and relative ease of processing, compared to other Wide-Bandgap Semiconductors.

It is also noted that MOS Gates can comprise metal, and/or non-metal components. The present invention includes any such applicable configuration.

The invention will be better understood by reference the Detailed Description Section of this Specification, in conjunction with the Drawings.

DETAILED DESCRIPTION

Figure 1:
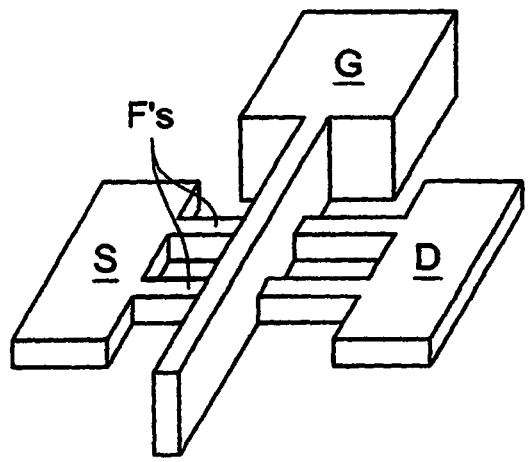
FIG. 1 shows a perspective view of a prior art FINFET.

FIG. 1 shows a perspective view of a prior art early depiction of a FINFET, adapted from U.S. Pat. No. 6,413, 802. This Figure is provided as it provides insight as to how inventor Welch herein conceived the present invention. Basically, replacing the Drain (D) with a Material that forms rectifying junctions with both N and P-type material, results in the present invention structure.

Figure 2:
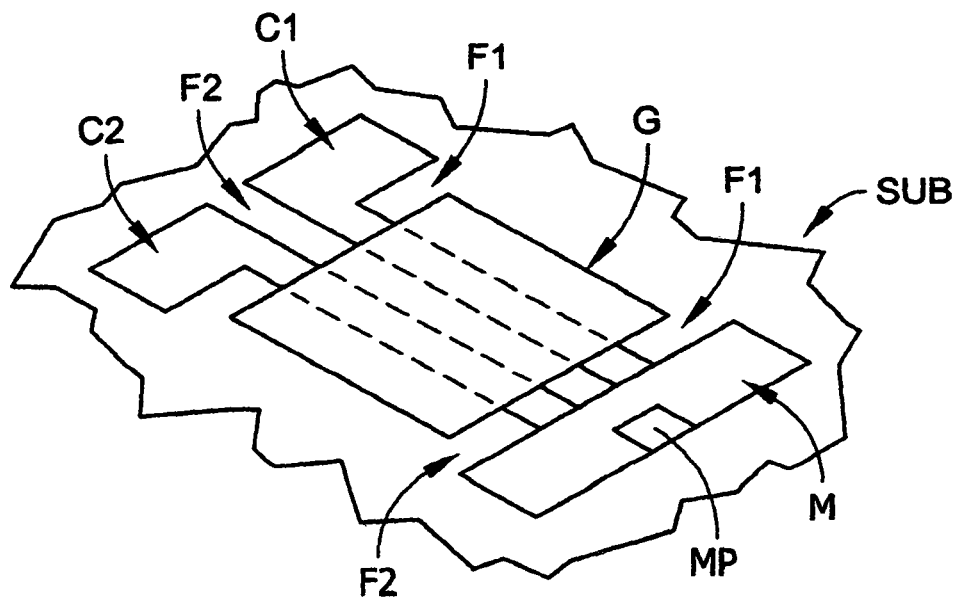
FIG. 2 shows a perspective view of a present invention Compact FINFET CMOS system.

FIG. 2 shows a perspective view of a present invention Compact CMOS system in a planar substrate. Note the presence of a region of material (M) in a semiconductor substrate (SUB) which forms rectifying junctions with both field induced N and P-type semiconductor. The compact CMOS structure further comprises at least two Channels, (eg. indicated as FINS (F1) (F2)) projecting from electrical contact with said region of material in a semiconductor substrate which forms rectifying junctions with both field induced N and P-type semiconductor (M), said FINS (F1) (F2) being substantially parallel and adjacent to one another to make the system as compact as possible. Said compact CMOS structure further comprises a gate (G) structure offset with respect to said FINS (F1) (F2) by insulating material (I) as shown better in FIG. 3. The compact CMOS structure further comprises substantially non-rectifying junctions (C1), (C2) and (MP) to said distal ends of said at least two FINS material (F1) (F2) and to the Material (M), respectively. It is to be understood that a region out from under the Gate that provides indication of FINS (F1) and (F2) FIG. 2 is not meant to imply that any distance must be present in a fabricated system, but is there only to allow indication (F1) and (F2). In a preferred embodiment there is little such gap between the left and right side of the Gate (G) and the substantially non-rectifying junctions (C1) (C2) and (M).

Figure 3:
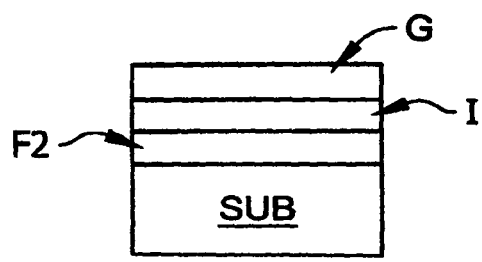
FIG. 3 is shows a front elevational view of the FIG. 2 system, showing the Insulator (I) between the Gate (G) and FIN (F2).

FIG. 3 is included to as a front elevational view of the FIG. 2 system, showing the Insulator (I) between the Gate (G) and FIN (F2). Note that the Gate (G) can be a metal or a composite of metal and non-metal components. Further, the Insulator under the Gate (G) can be much thinner than at other locations, and/or the Gate (G) can be of a nature that is present only above a Channel Region (F1) (F2), as FIG. 2 can be interpreted to show, or it can be present on one of both sides and above a FIN Channel region in a semiconductor substrate, as shown in FIG. 1. The later point is not a determining factor as regards Patentability. That, it is believed is found in the unique combination teachings regarding application of material in a semiconductor substrate which forms rectifying junctions with both field induced N and P-type semiconductor in the identified Patents by Welch, which teaching have not previously been applied to systems comprising parallel adjacent FINS or channels (F1) (F2), and in the many FINFET related Patents, such as U.S. Pat. No. 6,413,802 to Hu et al. Inventor Welch has combined elements, each arguably present in various prior art publications, in a novel way he was positioned to appreciate resulting from a chance discovery in his Masters work that Chromium annealed to N-type Silicon formed a very good rectifying junction, in combination with discovery of the previously mentioned Lepselter and Sultanov article which reported Chromium did likewise with P-type Silicon, all in combination with recently developed insight to the FINFET structure which naturally lends itself to providing substantially parallel and adjacent Channel regions (F1) (F2) which can both be conveniently subject to a single Gate (G) voltage in use. MOSFET structures that are formed from sequential N and P-Channel devices in N and P doped regions on a substrate must use a split gate as did the results Welch reported in his previous Patents. The present invention, again, does not require space consuming alternating N and P-type regions in a substrate, but rather uses only a single Intrinsic or Compensated substrate and positions Channels substantially parallel and adjacent to one another to achieve a Compact end result.

Figure 5:
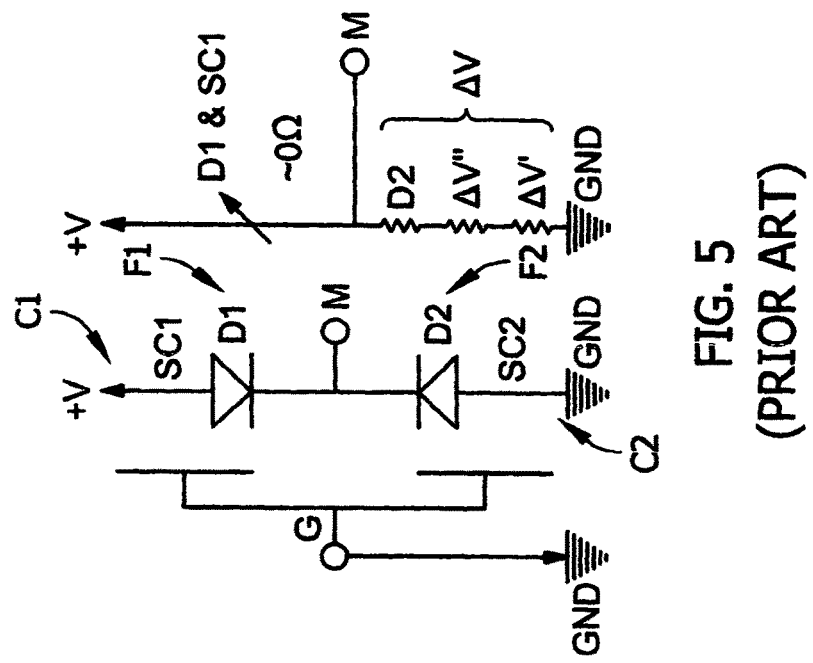
FIGS. 4 and 5 are adapted from Patent to Welch, No. 6, 624, 493 and serve to indicate the Inverting Nature of the present invention.
Figure 4:
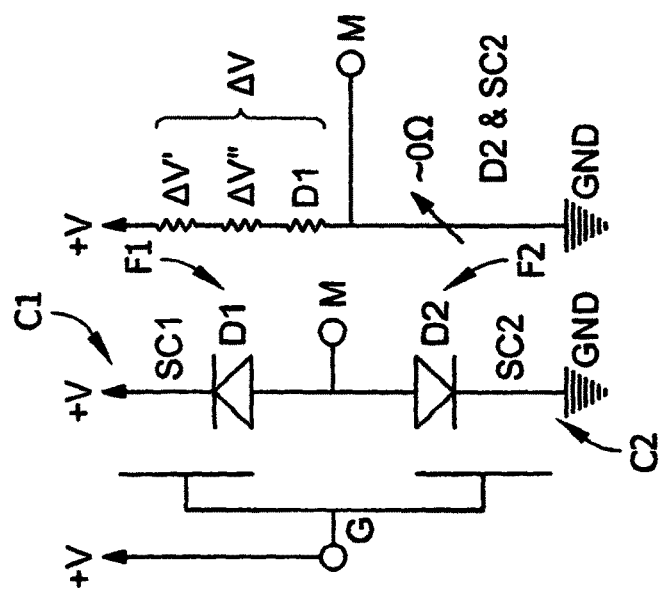

FIGS. 4 and 5 are adapted from Patent to Welch, No. 6,624,493, amongst other publications by Welch, and serve to indicate the Inverting Nature of the present invention. Said Figs. show an exemplary biasing situation wherein a Positive Voltage is applied to (C1), and (C2) is Grounded. The Ground could just as well be a Negative Voltage and therefore FIGS. 4 and 5 are not limiting. Note that when the Gate (G) Voltage is at +V in FIG. 4, the Midpoint (MP) of the present Compact FINFET CMOS system is at Ground (GND). FIG. 5 shows that when the Gate (G) Voltage is at Ground (GND), the Midpoint (MP) of the present Compact FINFET CMOS system is at +V, thus Inversion occurs. As perhaps better described in the previously mentioned unpublished Thesis by Welch, it should be appreciated that the same Gate voltage is applied to Gates (G) in both Channel Regions (F1) and (F2). When the Gate Voltage is High at +V, electrons are attracted into both Cannels (F1) and (F2), which makes the Lower junction D2 Forward Biased, and when Gate Voltage is Low at Ground (or a negative value) Holes are pulled into both Channel Regions (F1) and (F2) the Upper junction (D1) is Forward-biased. In the First Case the voltage appearing at the Midpoint (MP) is Low and in the Second Cases the midpoint (MP) Voltage is high, thus Inversion is accomplished. It is also noted that an Off Side will present barriers to Conduction as a result of at least two sources. First a Channel Pinchoff Voltage ($\Delta V'$), and Second a Channel Resistance ($\Delta V''$) will be present.

It is noted that in Inventor Welch's earlier Single Device CMOS fabrication work under the previously mentioned DOE Grant, the two device channels (equivalent to the two FINS (F1) and (F2) were sequential, hence the Gate was split and the resulting S-CMOS devices were not very compact, much as is the case with conventional P-N Junction based CMOS systems. In the present Compact FINFET CMOS system however, the substantially parallel and adjacent FINS (Channels) (F1) and (F2) are present adjacent to one another, and operated from a single Gate (G) structure. This is why the present FINFET system is compact. The present Device Configuration is not, to Inventor Welch's knowledge, remotely suggested in any prior art. It was only because of Inventor Welch's prior experience that the Present Invention conceived. Note as well that no N and P-type wells are necessary to fabricate P and N Channel MOSFETS as now Claimed. Inventor Welch did his earlier DOE sponsored fabrication of Single Device CMOS on Intrinsic Silicon, (see his U.S. Pat. Nos. 6,624,493; 5,663,584; 5,760,449; 6,091,128 and 6,286,636) and the previously mentioned Unpublished Thesis, but it is thought that use of Compensated Semiconductor might provide benefit, though there was not time to try that prior work. This lack of the need for space consuming N and P-doped wells is another factor that enables the present system to be compact, and makes the present invention less energy intensive to realize. For emphasis, the major factor enabling the present invention is that some materials (M) form rectifying junctions with either N or P-type filed induced effective doping n a Channel region of a MOSFET. FIGS. 4 and 5 demonstrate the benefit that provides. A further consideration is that P-N junctions involve space-charge regions which limit how small a channel can be without punch-through occurring. This is not a problem where the junctions are hot carrier type as in the present invention. It is believed Patentability attaches to the Present Invention as it overcomes many problems associated with previously known CMOS structures, while importantly, providing a very compact system via placement of channels adjacent to one another both of which are influenced by a single Gate (G).

It is noted that "substantially non-rectifying" and "Substantially ohmic" are to be read as equivalent herein.

Finally, the present invention in FIG. 2 can be viewed as a prior art FIG. 1 system in which the Drain (D) is replaced with a region of material (M) that forms rectifying junctions with both field induced N and P-type semiconductor, and the Gate (G) is expanded to cover more of the FIG. 1 FIN Channels (F's). Nothing in Hu et al. 802 or any other known reference remotely suggests that. Further nothing in Hu et al. 802 remotely suggests that one skilled in the art of FINFET systems should seek out material that forms rectifying junctions with both field induced N and P-type semiconductor. It is only because of Inventor Welch's experience and insight in the area that he conceived the present invention. Further, Inventor Welch has found that his idea of using material that forms rectifying junctions with both field induced N and P-type semiconductor seems not to have been generally appreciated by people involved in solid state device design. A Professor at Illinois University for instance, when asked by the Government to evaluate his work based on his first Patent in the area—thoroughly trashed it. When Inventor Welch phoned that Professor and walked him through it, he commented that he had completely missed the invention—and that Welch had performed Ph.D. level research. No further funding developed, however.

Having hereby disclosed the subject matter of the present invention, it should be obvious that many modifications, substitutions and variations of the present invention are possible in view of the teachings. It is therefore to be understood that the invention may be practiced other than as specifically described, and should be limited only in its breadth and scope only by the Claims.

I claim:

1. A compact CMOS structure comprising a region of material in a semiconductor substrate which forms rectifying junctions with both field induced N and P-type semiconductor, said compact CMOS structure further comprising at least two channels projecting from electrical contact with said region of material in a semiconductor substrate which forms rectifying junctions with both field induced N and P-type semiconductor, said channels being substantially parallel and adjacent to one another;

said compact CMOS structure further comprising a gate structure offset with respect to said channels by insulating material;

said compact CMOS structure further comprising substantially non-rectifying junctions to said region of material which forms rectifying junctions with both field induced N and P-type semiconductor, and to distal ends of said at least two channels;

said substrate, at least in the regions of said channels being characterized by a selection from the group consisting of:

it is substantially or per se. intrinsic;

it is substantially or per se. compensated;

it contains both N and P-type dopants in unequal concentrations;

such that in use a voltage is applied between the substantially non-rectifying junctions at the distal ends of said at least two channels and a voltage is applied to said gate which, when switched between the voltages applied to the substantially non-rectifying distal ends of said at least two channels, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said at least two channels is applied to said gate, the voltage at the substantially non-rectifying junction to said region of material which forms rectifying junctions with both field induced N and P-type semiconductor is low, and vice-versa.

2. The compact CMOS structure as in claim 1, wherein the at least two channels are formed in silicon, and the region of material which forms rectifying junctions with both field induced N and P-type semiconductor is chromium disilicide.

3. The compact CMOS structure as in claim 1, wherein the at least two channels are formed in other than silicon.

4. The compact CMOS structure as in claim 1, in which the gate comprises metal and/or non-metal components.

5. A compact FINFET CMOS structure comprising a region of material in a semiconductor substrate which forms rectifying junctions with both field induced N and P-type semiconductor, said compact CMOS structure further comprising at least two FIN channels projecting from electrical contact with said region of material in a semiconductor substrate which forms rectifying junctions with both field induced N and P-type semiconductor, said FIN channels being substantially parallel and adjacent to one another;

said compact FINFET CMOS structure further comprising a gate structure offset with respect to said FIN channels by insulating material;

said compact FINFET CMOS structure further comprising substantially non-rectifying junctions to said region of material which forms rectifying junctions with both field induced N and P-type semiconductor, and to distal ends of said at least two FIN channels;

said substrate, at least in the regions of said FINFETs being characterized by a selection from the group consisting of:
  it is substantially or per se. intrinsic;
  it is substantially or per se. compensated;
  it contains both N and P-type dopants in unequal concentrations;

such that in use a voltage is applied between the substantially non-rectifying junctions at the distal ends of said at least two FIN channels and a voltage is applied to said gate which, when switched between the voltages applied to the substantially non-rectifying distal ends of said at least two FIN channels, causes a voltage to appear at the substantially non-rectifying junction to said region of material which forms rectifying junctions with both field induced N and P-type semiconductor which is inverted, in that when the higher of said voltages applied to the substantially non-rectifying junctions to said distal ends of said at least two FIN channels is applied to said gate, the voltage at the substantially non-rectifying junction to said region of material which forms rectifying junctions with both field induced N and P-type semiconductor is low, and vice-versa.

\* \* \* \* \*